(12) United States Patent
Kato et al.

(10) Patent No.: US 12,344,019 B2
(45) Date of Patent: Jul. 1, 2025

(54) PRINTING CONTROL DEVICE AND PRINTING CONTROL METHOD

(71) Applicant: FUJI CORPORATION, Chiryu (JP)

(72) Inventors: Mitsuaki Kato, Anjo (JP); Naoya Niimi, Takahama (JP)

(73) Assignee: FUJI CORPORATION, Chiryu (JP)

( * ) Notice: Subject to any disclaimer, the term of this patent is extended or adjusted under 35 U.S.C. 154(b) by 272 days.

(21) Appl. No.: 17/907,288

(22) PCT Filed: Mar. 31, 2020

(86) PCT No.: PCT/JP2020/014729
§ 371 (c)(1),
(2) Date: Sep. 26, 2022

(87) PCT Pub. No.: WO2021/199229
PCT Pub. Date: Oct. 7, 2021

(65) Prior Publication Data
US 2023/0115630 A1    Apr. 13, 2023

(51) Int. Cl.
*B41F 15/08*     (2006.01)
*B41F 33/16*     (2006.01)
*B41M 1/12*      (2006.01)
*H05K 3/12*      (2006.01)

(52) U.S. Cl.
CPC ............ *B41M 1/12* (2013.01); *B41F 33/16* (2013.01); *H05K 3/12* (2013.01); *H05K 2203/0139* (2013.01)

(58) Field of Classification Search
None
See application file for complete search history.

(56) References Cited

FOREIGN PATENT DOCUMENTS

| EP | 3653380 A1 | * | 5/2020 | .......... B41F 15/0881 |
|---|---|---|---|---|
| JP | 2000211108 A | * | 8/2000 | |
| JP | 2005-205826 A | | 8/2005 | |
| WO | WO-2024157387 A1 | * | 8/2024 | |

OTHER PUBLICATIONS

English language translation of JP 2000211108 A to Miwa Takeshi, publication date Aug. 2, 2000. (Year: 2000).*
English language translation of WO 2024/157387 A1 to Tamaki Eiichi, publication date Aug. 2, 2024. (Year: 2024).*
International Search Report Issued Jun. 30, 2020, in PCT/JP2020/014729, filed on Mar. 31, 2020, 3 pages.

* cited by examiner

*Primary Examiner* — Leslie J Evanisko
(74) *Attorney, Agent, or Firm* — Oblon, McClelland, Maier & Neustadt, L.L.P.

(57) ABSTRACT

A printing control device includes a determination section, a first printing control section, a movement controller, and a second printing control section. When the determination section determines that an elapsed time in which no board is convey exceeds an allowable time, the first printing control section causes the printer to execute the printing process for a first time on a first board which is conveyed in since the determination is made. The movement controller separates the mask and the board from each other after the first printing control section executes the printing process for the first time and brings the mask and the board into abutment with each other again after the separation. The second printing control section causes the printer to execute the printing process for a second time on the board after the movement controller brings the mask and the board into abutment with each other again.

11 Claims, 5 Drawing Sheets

PRINTING CONTROL DEVICE AND PRINTING CONTROL METHOD

TECHNICAL FIELD

The present description discloses a technology related to a printing control device and a printing control method.

BACKGROUND ART

With a screen printing method described in Patent Literature 1, a screen printing device stops its automatic operation and issues a warning in case that a device stop state continues for a period of time equal to or longer than a time which is set in advance as a reference time requiring a check on a paste state. The operator is then urged to check on the paste state by the warning displayed on a screen. In addition, when the operator determines it appropriate to execute an overlay printing in which cream solder is overlay printed successively multiple times on the same board, with the screen printing method, the screen printing device executes the overlay printing.

PATENT LITERATURE

Patent Literature 1: JP-A-2005-205826

BRIEF SUMMARY

Technical Problem

When the mask and the board are separated from each other in order to unload the board on which the printing process has been executed by the printer, solder remaining in the opening portions in the mask begin to dry. Normally, since a subsequent board is loaded or conveyed in within a predetermined allowable time for execution of a printing process on the board, the possibility that the viscosity of the solder becomes so high that the solder has difficulty in separating from a wall surface of the opening portion is small.

However, for example, there will be a case in which there is caused a certain failure on a board working line, and a subsequent board is not conveyed in even after the allowable time has elapsed, whereby no printing process is executed. Thereafter, when a board is conveyed in, and a printing process is executed, there is caused the possibility that the solder has then difficulty in separating from the wall surfaces of the opening portions, and this reduces an amount of solder printed on the board, whereby the printing quality is deteriorated.

In view of these circumstances, the present description discloses a printing control device and a printing control method which can suppress the deterioration in printing quality when an elapsed time which elapses from a point in time when a mask and a board are separated to unload the board on which a printer has executed a printing process without conveyance of a subsequent board exceeds a predetermined allowable time.

Solution to Problem

The present description discloses a printing control device including a determination section, a first printing control section, a movement controller, and a second printing control section. The determination section determines whether an elapsed time, which constitutes a time which elapses with no subsequent board being conveyed in since a point in time when a mask and a board, on which a printer, configured to execute a printing process of printing a solder on a board through an opening portion in the mask by a squeegee sliding on the mask, executes the printing process, are separated to convey out the board, exceeds a predetermined allowable time. When the determination section determines that the elapsed time exceeds the allowable time, the first printing control section causes the printer to execute the printing process for a first time on at least a first board which is conveyed in since the determination is made. The movement controller separates the mask and the board from each other after the first printing control section executes the printing process for the first time and brings the mask and the board into abutment with each other again after the separation. The second printing control section causes the printer to execute the printing process for a second time on the board after the movement controller brings the mask and the board into abutment with each other again.

In addition, the present description discloses a printing control method including a determination step, a first printing control step, a movement control step, and a second printing control step. The determination step is configured to determine whether an elapsed time, which constitutes a time which elapses with no subsequent board being conveyed in since a point in time when a mask and a board, on which a printer, configured to execute a printing process of printing a solder on a board through an opening portion in the mask by a squeegee sliding on the mask, executes the printing process, are separated to convey out the board, exceeds a predetermined allowable time. The first printing control step is configured, when the determination step determines that the elapsed time exceeds the allowable time, to cause the printer to execute the printing process for a first time on at least a first board which is conveyed in since the determination is made. The movement control step is configured to separate the mask and the board from each other after the first printing control step causes the printing process to be executed for the first time and bring the mask and the board into abutment with each other again after the separation. The second printing control step is configured to cause the printer to execute the printing process for a second time on the board after the movement control step brings the mask and the board into abutment with each other again.

Advantageous Effects

With the printing control device described above, the printing control device includes the determination section, the first printing control section, the movement controller, and the second printing control section. As a result, when the determination section determines that the elapsed time exceeds the allowable time, the first printing control section causes the printer to execute the first printing process to thereby supply solder to the opening portion in the mask. Since the movement controller separates the mask and the board in this state, the solder is made to flow easily. Thereafter, since the movement controller brings the mask and the board into abutment with each other, the solder is made to flow more easily. As a result, the viscosity of the solder remaining in the opening portion in the mask is reduced, thereby facilitating the separation of the solder from a wall surface of the opening portion. Since the second printing control section causes the printer to execute the second printing process in this state, a reduction in the amount of solder printed on the board can be suppressed, thereby making it possible to suppress a deterioration in printing quality. What has been described above with respect to the printing control device is also similarly applied to the printing control method.

DESCRIPTION OF EMBODIMENTS

1. Embodiment 1-1. Configuration Example of Board Working Line WL0

Figure 1:
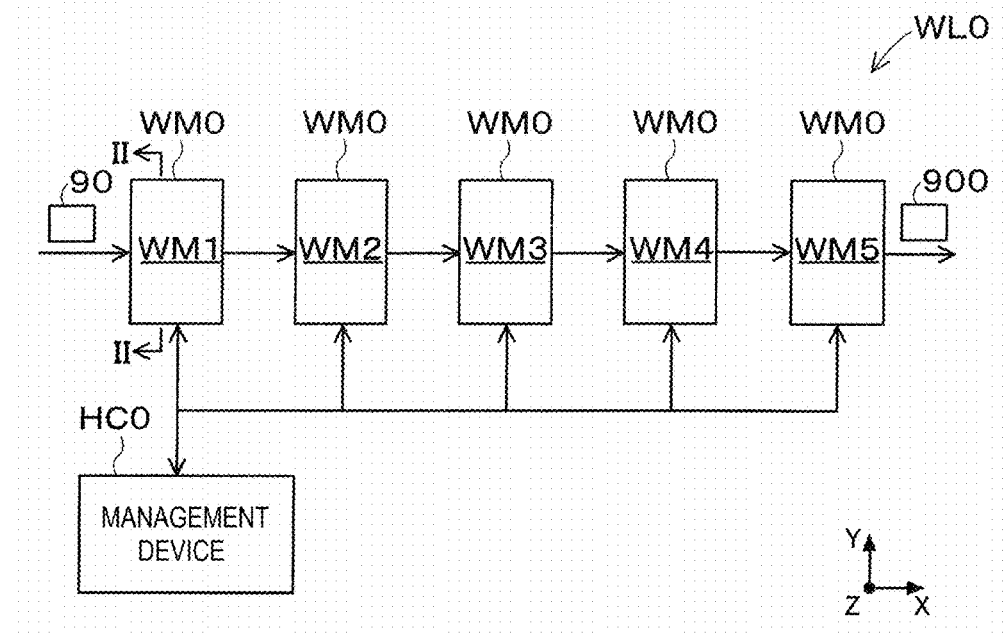
FIG. 1 A schematic diagram illustrating a configuration example of a board working line.

Predetermined board work is performed on board 90 in board working line WL0. Board working line WL0 of the present embodiment need only include printer WM1, and the types and number of board work machines WM0 making up board working line WL0 are not limited in any way. As illustrated in FIG. 1, board working line WL0 of the present embodiment includes multiple (five) board work machines WM0 such as printer WM1, printing inspector WM2, component mounter WM3, reflow furnace WM4, and appearance inspector WM5, and board 90 is conveyed in this order by a board conveyance device.

Printer WM1 prints solder 80 in multiple component mounting positions on board 90. Printing inspector WM2 inspects a print state of solder 80 printed by printer WM1. Component mount WM3 mounts multiple components on board 90 on which solder 80 is printed by printer WM1. One or multiple component mounters WM3 may be provided. In the case that multiple component mounters WM3 are provided, those multiple component mounters WM3 can share a mounting process of mounting multiple components.

Reflow furnace WM4 heats board 90 on which multiple components are mounted by component mounter WM3 to melt solder 80 for soldering. Appearance inspector WM5 inspects a mounting state or the like of the multiple components mounted by component mounter WM3. With board working line WL0 configured as described above, board 90 is conveyed sequentially so that the production process including the inspection process is executed thereon using those multiple (five) board work machines WM0 for production of board product 900. Additionally, board working line WL0 can also include board work machines WM0 such as, for example, a function inspector, a buffer device, a boar supply device, a board flipping device, a shield mounting device, an adhesive application device, an ultraviolet ray irradiation device, and the like as required.

Multiple (five) board work machines WM0 and management device HC0, which make up board working line WL0, are electrically connected by a communication section. The communication section connects them communicably in a wired or wireless fashion. In addition, various communication methods can be adopted. In the present embodiment, a Local Area Network (LAN) is configured by multiple (five) board work machines WM0 and management device HC0. As a result, multiple (five) board work machines WM0 can communicate with one another by way of the communication section. Further, multiple (five) board work machines WM0 can communicate with management device HC0 by way of the communication section.

Management device HC0 controls multiple (five) board work machines WM0, which makes up board working line WL0, and monitors the operation status of board working line WL0. Management device HC0 stores various control data for controlling multiple (five) board work machines WM0. Management device HC0 transmits the control data to each of multiple (five) board work machines WM0. In addition, each of multiple (five) board work machines WM0 transmits the operation status and production status thereof to management device HC0.

1-2. Configuration Example of Printer WM1

Figure 2:
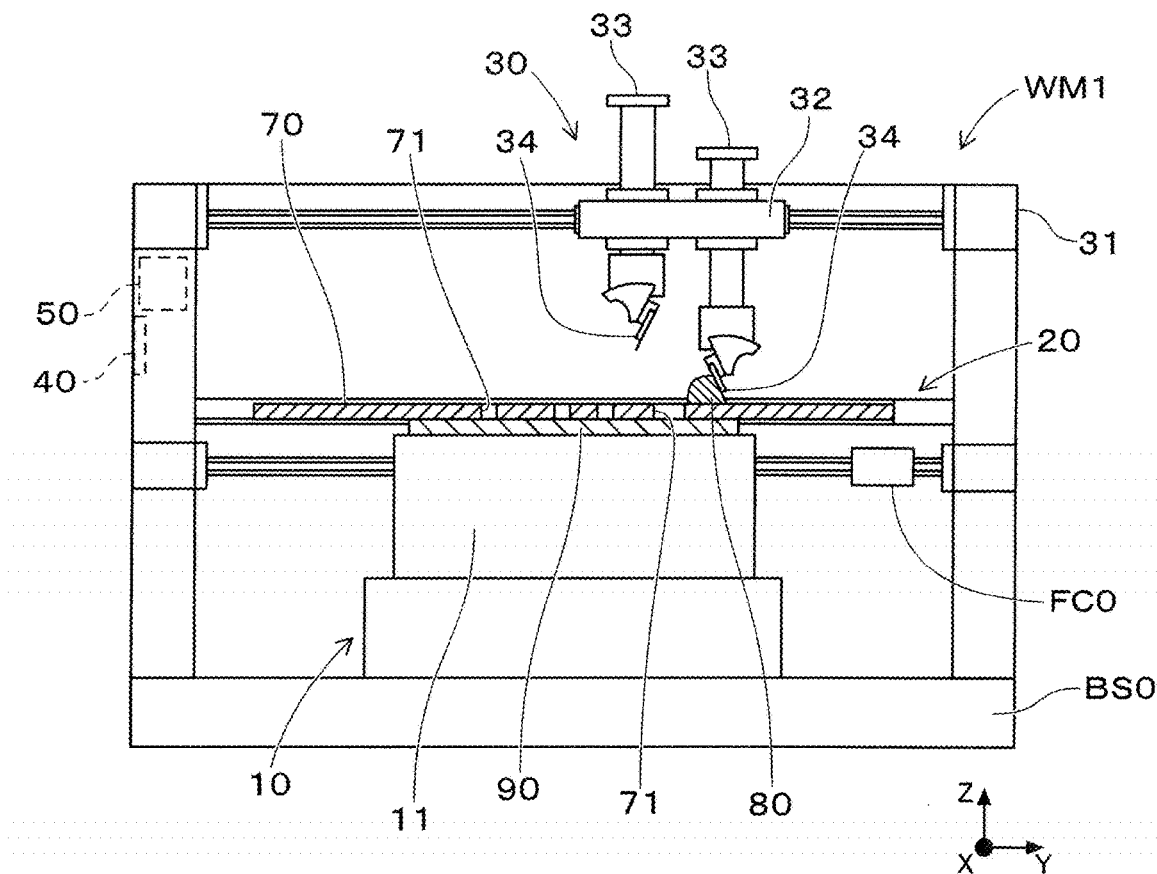
FIG. 2 A partial sectional view illustrating a configuration example of a printer.

Printer WM1 of the present embodiment executes a printing process in such a manner that squeegee 34 slides on mask 70 to print solder 80 on board 90 through opening portion 71 in mask 70. As illustrated in FIG. 2, printer WM1 includes board conveyance device 10, mask supporting device 20, squeegee moving device 30, display device 40, and control device 50. In the present description, a conveyance direction of board 90 (a perpendicular direction to a surface of a sheet of paper on which FIG. 2 is drawn) is referred to as an X-axis direction, a front-rear direction of printer WM1 which is orthogonal to an X-axis (a left-right direction on the surface of the sheet of paper on which FIG. 2 is drawn) is referred to as a Y-axis direction, and a vertical direction which is orthogonal to the X-axis and a Y-axis (an up-down direction on the surface of the sheet of paper on which FIG. 2 is drawn) is referred to as a Z-axis direction.

Board conveyance device 10 conveys board 90, which is a printing target. Board 90 is a circuit board, on which an electronic circuit, an electrical circuit, a magnetic circuit, and the like are formed. Board conveyance device 10 is provided on a base BS0 of printer WM1. Board conveyance device 10 conveys board 90 disposed on a pallet by, for example, a belt conveyor extending in the X-axis direction.

Board conveyance device 10 includes board holding section 11 for holding board 90 which is conveyed into printer WM1. Board holding section 11 is provided below mask 70, and is configured so as to be lifted up and lowered in the Z-axis direction by a linear motion mechanism such as a feeding screw mechanism, for example. Specifically, board holding section 11 is lowered while board 90 is being conveyed, and when board 90 is conveyed into a predetermined position, board holding section 11 is lifted up together with board 90 so as to hold board 90 with an upper surface of board 90 adhering to a lower surface of mask 70.

Mask supporting device 20 is provided above board conveyance device 10. Mask supporting device 20 supports mask 70 with a pair of support tables. The pair of support tables are disposed individually at a left-hand side (a far side of the sheet of paper on which FIG. 2 is drawn, which is not illustrated therein) and a right-hand side (a near side of the sheet of paper on which FIG. 2 is drawn, which is not illustrated therein) of printer WM1 as seen from a front thereof, and are formed so as to extend along the Y-axis direction.

FIG. 2 is a partial sectional view of printer WM1 taken along the Y-axis direction, and schematically illustrates an inside of printer WM1 and sections of mask 70 and board 90 as seen from a side of printer WM1. Opening portion 71 is formed in mask 70 in such a manner as to penetrate mask 70 in a predetermined position on a wiring pattern on board 90. Mask 70 is supported by mask supporting device 20 via a frame member provided on an outer peripheral edge thereof, for example.

Squeegee moving device 30 lifts up and lowers squeegee 34 in a perpendicular direction (the Z-axis direction) to mask 70 and moves squeegee 34 in the Y-axis direction on an upper surface of mask 70. Squeegee moving device 30 includes head driving device 31, squeegee head 32, pair of lifting and lowering devices 33, 33, and pair of squeegees 34, 34. Head driving device 31 is disposed at an upper portion side of printer WM1. Head driving device 31 can move squeegee head 32 in the Y-axis direction by, for example, a linear motion mechanism such as a feeding screw mechanism.

Squeegee head 32 is clamped and fixed to a moving body constituting the linear motion mechanism of head driving device 31. Squeegee head 32 holds pair of lifting and lowering devices 33, 33. Pair of lifting and lowering devices 33, 33 can individually hold corresponding squeegees 34, and can be driven independently of each other. Pair of lifting and lowering devices 33, 33 individually lift up and lower corresponding squeegees 34 held thereby by driving, for example, an actuator such as an air cylinder.

Pair of squeegees 34, 34 slide on the upper surface of mask 70 to move solder 80 supplied to the upper surface of mask 70 along mask 70. A cream solder (solder paste) can be used for solder 80. Solder 80 is pressed onto board 90 through opening portion 71 in mask 70, whereby solder 80 is printed on board 90 disposed on a lower surface side of mask 70. In the present embodiment, each of pair of squeegees 34, 34 is a plate-like member formed in such a manner as to extend along the X-axis direction, which is orthogonal to a printing direction (the Y-axis direction).

Of pair of squeegees 34, 34, front (left on the sheet of paper on which FIG. 2 is drawn) squeegee 34 is used for a printing process of moving solder 80 from a front side towards a rear side and advances in a direction directed from a front side to a rear side of printer WM1 as its advancing direction. Of pair of squeegees 34, 34, rear (right on the sheet of paper on which FIG. 2 is drawn) squeegee 34 is used for a printing process of moving solder 80 from the rear side towards the front side and advances in a direction directed from the rear side towards the front side of printer WM1 as its advancing direction. With either of squeegees 34, a direction opposite to the advancing direction is referred to as a retreating direction.

Each of pair of squeegees 34, 34 is held to lifting and lowering device 33 while being inclined in such a manner that a front face portion positioned on an advancing side is directed downwards. In other words, each of pair of squeegees 34, 34 is held to lifting and lowering device 33 while being inclined in such a manner that a back surface portion, positioned on a retreat side, is directed upwards. An inclination angle of each of pair of squeegees 34, 34 is adjusted by an adjustment mechanism provided at a lower portion of corresponding lifting and lowering device 33.

Display device 40 can display a work status of printer WM1. Display device 40 of the present embodiment is made up of a touch panel and also functions as an input device for receiving various operations by an operator.

Control device 50 includes a well-known arithmetic unit and storage device, and a control circuit is formed. Control device 50 is communicably connected with management device HC0, illustrated in FIG. 1, via the communication section, and can transmit and receive various data. Control device 50 can drive and control board conveyance device 10, mask supporting device 20, squeegee moving device 30, and display device 40 based on a production program, detection results of various sensors, and the like.

Control device 50 acquires various information stored in the storage device and detection results of various sensors provided in printer WM1. The storage device stores a production program or the like for driving printer WM1. Control device 50 drives and controls squeegee moving device 30, for example. Control device 50 sends out a control signal to squeegee moving device 30 based on the various information and detection results which are described above. As a result, positions in the Y-axis direction and positions (heights) in the Z-axis direction, as well as movement speeds and inclination angles of pair of squeegees 34, 34 held to squeegee head 32 are controlled. Then, as has been described above, pair of squeegees 34, 34 are driven and controlled to print solder 80 on substrate 90 disposed on the lower surface side of mask 70.

1-3. Configuration Example of Printing Control Device 60

1-3-1. Outline of Printing Control Device 60

Figure 3:
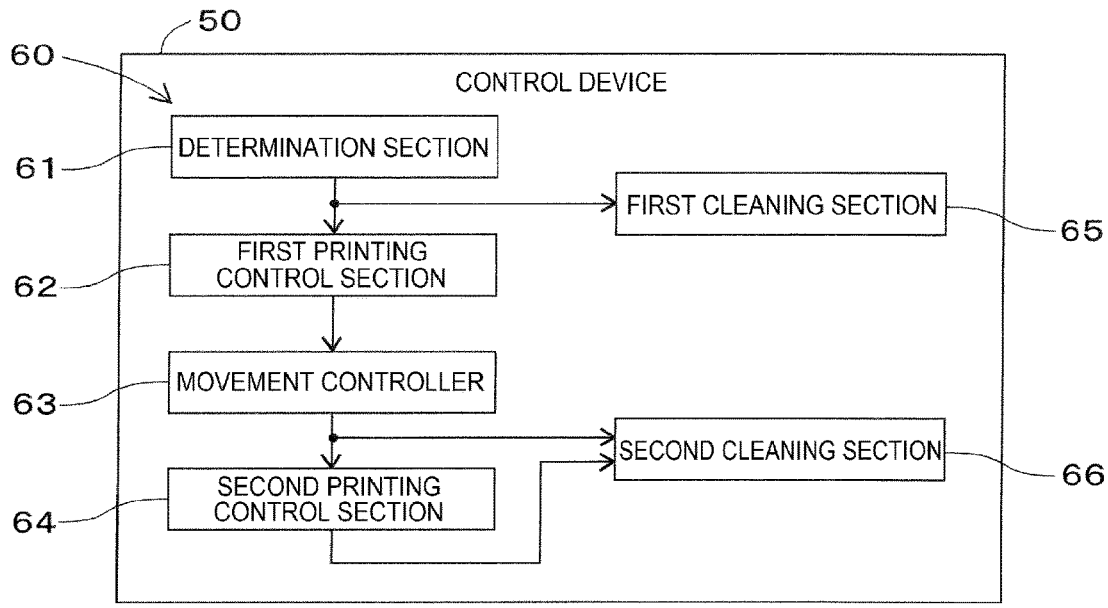
FIG. 3 A block diagram illustrating an example of a control block of a printing control device.

Printing control device 60 can be provided in various control devices, management devices, or the like. Printing control device 60 can be provided in, for example, control device 50, management device HC0, the management device for controlling multiple board working lines WL0, or the like of printer WM1. Additionally, printing control device 60 can also be formed on a cloud. As illustrated in FIG. 3, in the present embodiment, printing control device 60 is provided in control device 50 of printer WM1.

In addition, when taking it as a control block, control device 50 includes determination section 61, first printing control section 62, movement controller 63, and second printing control section 64. As illustrated in FIG. 3, printing control device 60 can further include at least one of first cleaning section 65 and second cleaning section 66. In a modified aspect which will be described later, printing control device 60 includes determination section 61, first printing control section 62, movement controller 63, second printing control section 64, first cleaning section 65, and second cleaning section 66.

Figure 4:
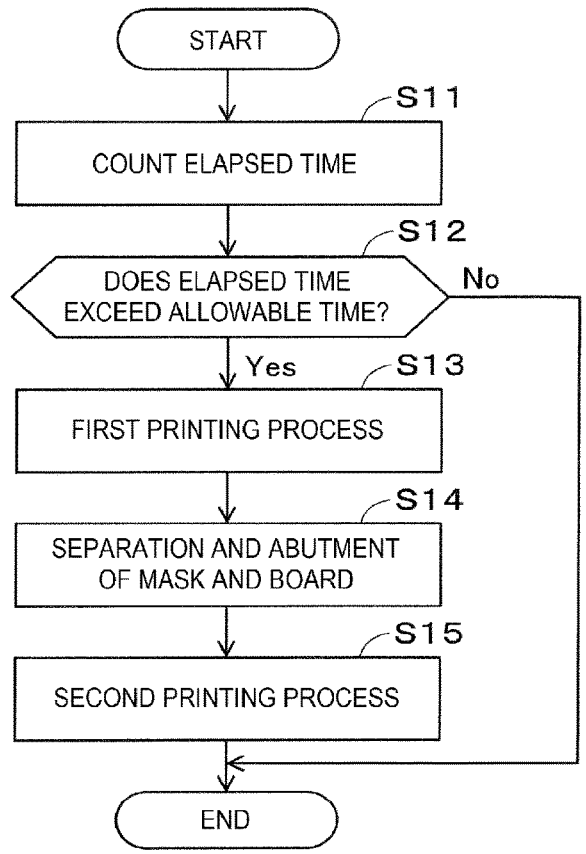
FIG. 4 A flowchart showing an example of a control procedure performed by the printing control device.

Further, in the present embodiment, printing control device 60 executes a control in accordance with a flowchart shown in FIG. 4. Determination section 61 performs processing shown in step S11 and a determination shown in step S12. First printing control section 62 performs processing shown in step S13. Movement controller 63 performs processing shown in step S14. Second printing control section 64 performs processing shown in step S15.

When mask 70 and substrate 90 are separated from each other in order to unload substrate 90 on which printer WM1 has executed a printing process, solder 80 remaining in opening portion 71 in mask 70 starts to dry. Normally, since subsequent board 90 is conveyed in within a predetermined allowable time and another printing process is executed on relevant board 90, there are few cases in which the viscosity of solder 80 increases so high that solder 80 hardly separates from wall surface 71a of opening portion 71.

However, for example, there is a case in which a failure occurs in board working line WL0, preventing subsequent board 90 from being conveyed in even after the allowable time has elapsed, and no printing process is executed. For example, there is a case in which a component shortage occurs in component mounter WM3, and subsequent board 90 is not conveyed into printer WM1 until component mounter WM3 is provided with components.

Thereafter, when subsequent substrate 90 is conveyed in to start executing another printing process, solder 80 hardly separates from the wall surface 71a of opening portion 71, which decreases an amount of solder printed on relevant board 90, leading to a deteriorated printing quality. In the present description, a time which elapses from a point in time when mask 70 and board 90 on which printer WM1 has executed a printing process are separated from each other to unload or convey out relevant board 90 without a subsequent board 90 being conveyed in is referred to as an elapsed time.

Figure 5:
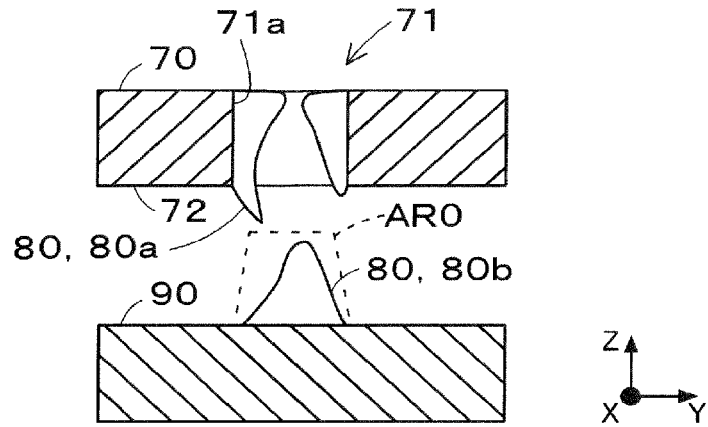
FIG. 5 A schematic diagram illustrating an example of a state in which solder separates hardly from a wall surface of an opening portion to thereby reduce an amount of solder printed on a board.

FIG. 5 illustrates an example of a state in which solder 80 hardly separates from wall surface 71a of opening portion 71, thereby reducing an amount of solder printed on board 90. FIG. 5 is a partially enlarged sectional view of mask 70 and board 90 taken by cutting mask 70 and board 90 along the Y-axis direction. What has been described above with respect to the way of illustration in FIG. 5 is also true with FIGS. 6 and 7.

FIG. 5 illustrates that the solder amount in which solder 80 (which is shown as 80a in FIG. 5) remains on wall surface 71a of opening portion 71 is increased more and the solder amount in which solder 80 (which is shown as 80b in FIG. 5) is printed on board 90 is decreased more when the elapsed time exceeds the allowable time than when the elapsed time remains within the allowable time. In addition, area AR0 illustrated as being surrounded by a dashed line in FIG. 5 represents a solder amount (a solder amount of solder to be printed on board 90) resulting when the elapsed time remains within the allowable time.

In this way, when the amount of solder printed on board 90 decreases, a volume of solder 80b printed thereon becomes smaller than a target value, leading to a possibility that a deterioration in printing quality such as absence or skip of solder 80b occurs. The absence of solder 80b means a state in which a surface area of solder 80b so printed is smaller than a target value. The skip of solder 80b means a state in which a height of solder 80b so printed is lower than a target value.

Then, in the present embodiment, printing control device 60 is provided on board working line WL0. When determination section 61 determines that the elapsed time exceeds the allowable time, first printing control section 62 causes printer WM1 to execute a first printing process so as to supply solder 80 to opening portion 71 in mask 70. Since movement controller 63 separates mask 70 and board 90 from each other in this state, solder 80a is made to flow easily. However, this state is similar to the state illustrated in FIG. 5.

Thereafter, since movement controller 63 brings mask 70 into abutment with board 90, solder 80a is made to flow more easily. As a result of these operations, the viscosity of solder 80a remaining in opening portion 71 in mask 70 is reduced, whereby solder 80a is made to separate from wall surface 71a of opening portion 71 easily. In this state, second printing control section 64 causes printer WM1 to execute a second printing process.

Figure 6:
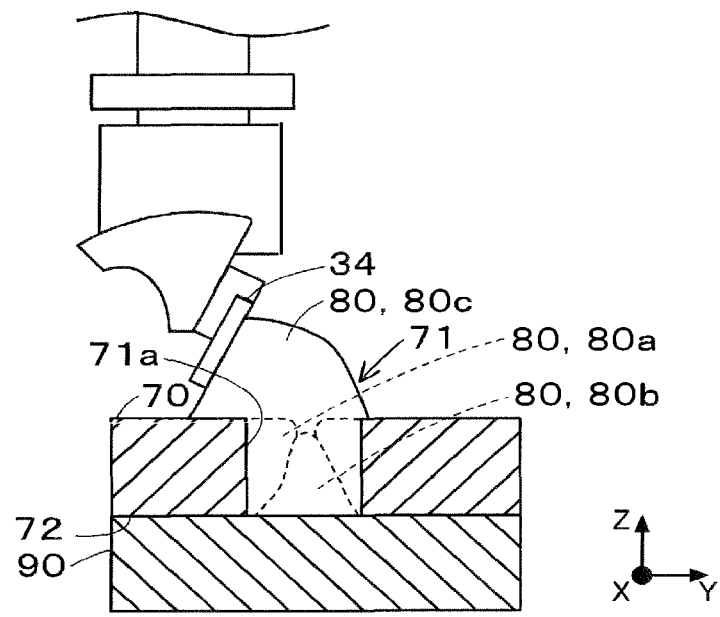
FIG. 6 A schematic diagram illustrating an example of a state of solder when a second printing process is executed.

FIG. 6 illustrates an example of a state of solder 80 when the second printing process is executed. FIG. 6 illustrates that the viscosity of solder 80 is reduced more than when the first printing process is executed. Specifically speaking, solder 80a remaining on wall surface 71a of opening portion 71, solder 80b printed on board 90 in the first printing process, and solder 80c supplied in the second printing process can flow in perfect harmony. When mask 70 and board 90 on which printer WM1 has executed the second printing process are separated from each other to convey out relevant board 90, solder 80 is made to flow further easily, and eventually, a state of solder 80 illustrated in FIG. 7 results.

Figure 7:
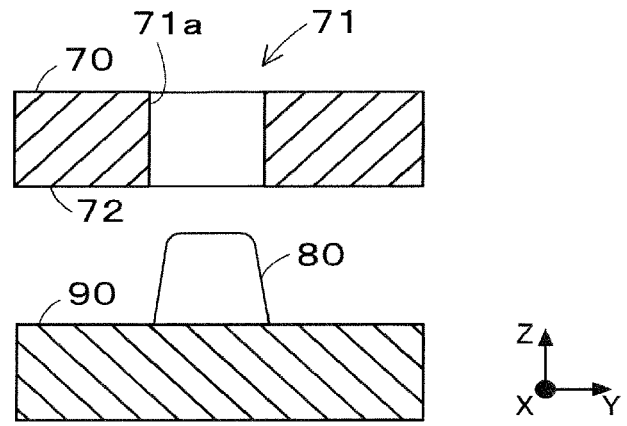
FIG. 7 A schematic diagram illustrating an example of an amount of solder when a second printing process is executed, whereafter a mask and a board are separated from each other.

FIG. 7 illustrates an example of a solder amount resulting when mask 70 and board 90 are separated from each other after the second printing process has been executed. FIG. 7 illustrates that the amount of solder 80a remaining on wall surface 71a of opening portion 71 is reduced equally as in a case in which the elapsed time remains within the allowable time. In addition, FIG. 7 illustrates that an amount of solder 80b equal to that in a case in which the elapsed time remains within the allowable time is printed on board 90. As a result, printing control device 60 can suppress the reduction in the solder amount of solder printed on board 90, thereby making it possible to suppress the deterioration in printing quality.

1-3-2. Determination Section 61

Determination section 61 determines whether an elapsed time, which constitutes a time which elapses with no subsequent board 90 being conveyed in since a point in time when mask 70 and board 90, on which printer WM1 executes the printing process, are separated to convey out relevant board 90, exceeds the predetermined allowable time (step S11 and step S12 shown in FIG. 4).

Specifically, determination section 61 starts to count the elapsed time when mask 70 and board 90, on which printer WM1 has executed a printing process, are separated from each other to convey out relevant board 90 (step S11). Then, determination section 61 determines whether the elapsed time exceeds the allowable time (step S12). The allowable time can be acquired in advance through simulation, measurement with an actual machine, or the like.

For example, printer WM1 executes the printing process while gradually increasing a conveyance wait time defined from the time when mask 70 and board 90 are separated from each other to the time when subsequent board 90 is conveyed in. As the conveyance wait time is increased, a printing failure starts to occur. Such a printing failure can be determined by, for example, printing inspector WM2 or can also be determined by an operator. The allowable time can be set to a short period of time which is shorter than the conveyance wait time when a printing failure starts to occur.

In addition, the allowable time can also be set in accordance with, for example, a type (for example, a viscosity or the like) of solder 80 to be used, a type of mask 70 (for example, a minimum surface area, a specific shape, if any, or the like of opening portion 71), and a printing environment (for example, an ambient temperature, humidity, or the like). For example, since the higher the viscosity of solder 80 increases, the more hardly solder 80 separates from wall surface 71a of opening portion 71, the allowable time can be set to be shorter as the viscosity of solder 80 increases higher.

In addition, since the smaller the minimum surface area of opening portion 71 in mask 70 becomes, the higher the degree of difficulty in executing the printing process increases and the more easily the printing quality is deteriorated, the allowable time can be set to be shorter as the minimum surface area of opening portion 71 becomes smaller. The minimum surface area of opening portion 71 refers to an opening surface area of smallest opening portion 71 in multiple opening portions 71 in mask 70. Further, since the degree of difficulty in executing the printing process increases high and the printing quality gets deteriorated easily when opening portion 71 exists which has a specific shape such as a thin elongated shape, the allowable time can be set to be shorter than a case in which opening portion 71 having such a specific shape does not exist. In addition, since the lower the ambient temperature and humidity at which printer WM1 executes the printing process become, the more easily solder 80 dries, and the more hardly solder 80 separates from wall surface 71a of opening portion 71, the allowable time can be set to be shorter as the ambient temperature and humidity at which printer WM1 executes the printing process become lower.

Determination section 61 stops counting the elapsed time once subsequent board 90 is conveyed in. As a result, normally, there is caused no case in which the elapsed time exceeds the allowable time. However, as described above, for example, when a failure occurs in board working line WL0, since no subsequent board 90 is conveyed into printer WM1, there is a possibility that the elapsed time exceeds the allowable time.

Figures 8, 9:
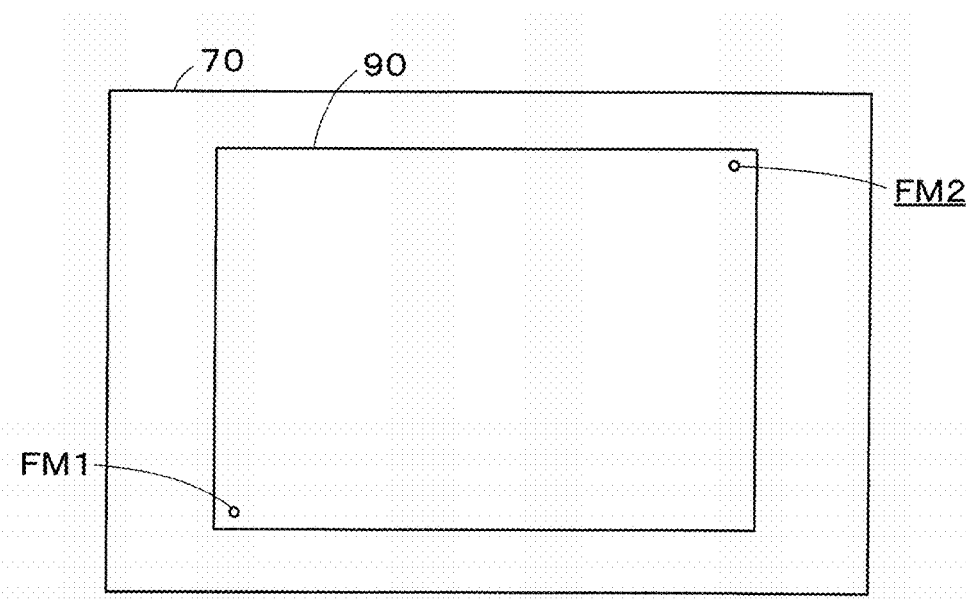
FIG. 8 A schematic diagram illustrating an example of inputs made by an operator.
FIG. 9 A plan view illustrating an example of positioning reference portions provided on a mask and a board.

The allowable time can also be set by, for example, an operator. FIG. 8 illustrates an example of inputs executed by the operator. For example, the operator can causes display device 40 to display operation phases thereon by operating operation sections BP11, BP21, BP31, and BP41 surrounded by dashed line BL1 in FIG. 8. For example, when the operator operates operation section BP11, display device 40 displays an operation in a preparation stage of a production program. When the operator operates operation section BP21, display device 40 displays an operation in a production stage. When the operator operates operation section BP31, display device 40 displays an operation in a clean-up stage. When the operator operates operation section BP41, display device 40 displays an operation in an error occurrence stage.

In addition, the operator can select or input an operation in each operation phase by operating operation sections surrounded by dashed line BL 2 after selecting the operation phase. Further, the operator can cause display device 40 to display thereon information on setting and adjustment of the board work machine by operating operation section BP51. For this operation, the operator can select or input the function of printer WM1 by operating operation section BP52. FIG. 8 shows that the operator inputs time TM1 as the allowable time for the elapsed time and that the allowable time for the elapsed time is set to time TM1.

1-3-3. First Printing Control Section 62

When determination section 61 determines that the elapsed time exceeds the allowable time, first printing control section 62 causes printer WM1 to execute a first printing process on at least first board 90 which is conveyed thereinto since the determination (step S13 in FIG. 4).

Specifically speaking, when determination section 61 determines that the elapsed time exceeds the allowable time (in the case of Yes in step S12), first printing control section 62 causes printer WM1 to execute the first printing process on at least first board 90 which is conveyed thereinto since the determination. As a result, solder 80 is supplied to opening portion 71 in mask 70. In the case that determination section 61 determines that the elapsed time does not exceed the allowable time (in the case of No in step S12), printing control device 60 temporarily ends the control, and the normal printing process is executed.

In the case that determination section 61 determines that the elapsed time exceeds the allowable time, the viscosity of solder 80 is higher than in the case that determination section 61 determines that the elapsed time does not exceed the allowable time. As a result, first printing control section 62 need only decrease a printing speed, which is a speed at which squeegee 34 slides on mask 70, lower than a printing speed used in a printing process executed when determination section 61 determines that the elapsed time does not exceed the allowable time. This allows solder 80 to be supplied more easily to opening portion 71 than in a case in which the printing speed is not changed.

In addition, first printing control section 62 need only increase a printing pressure, which is a pressure applied to mask 70 by squeegee 34 when squeegee 34 slides on mask 70, higher than a printing pressure used in a printing process executed when determination section 61 determines that the elapsed time does not exceed the allowable time. As a result, solder 80 is allowed to be supplied to opening portion 71 more easily than in the case that the printing pressure is not changed.

The printing speed and the printing pressure can be acquired in advance through simulation, measurement using an actual measurement machine, or the like, as in the case with the allowable time. In addition, the printing speed and the printing pressure can also set by, for example, the operator, as in the case with the allowable time. In this case, the operator selects Yes for a first printing process condition change on a display screen shown in FIG. 8. When the operator selects No for the first printing process condition change, the condition of a first printing process is set to the same condition as the condition of the printing process executed when determination section 61 determines that the elapsed time does not exceed the allowable time.

In addition, the operator can also select recipe or reciprocation for a first printing process printing method. When the operator selects the recipe, the printing process is executed using the same printing method (for example, single printing) as the printing method used for the printing process executed when determination section 61 determines that the elapsed time does not exceed the allowable time. Additionally, when the operator selects the reciprocation, the printing process is executed using a different printing method (for example, reciprocating printing) from the printing method used for the printing process executed when determination section 61 determines that the elapsed time does not exceed the allowable time. Further, in the case that the operator selects the reciprocation, the operator can also set the number of times of execution of the reciprocating printing.

With a ratio to the printing speed for the recipe, the operator can set a printing speed for the first printing process by inputting a ratio to the printing speed of the printing process, being executed when determination section 61 determines that the elapsed time does not exceed the allowable time, of which printing speed is referred to as 100%. Similarly, with a ratio to the printing pressure for the recipe, the operator can set a printing pressure for the first printing process by inputting a ratio to the printing pressure of the printing process, being executed when determination section 61 determines that the elapsed time does not exceed the allowable time, of which printing pressure is referred to as 100%.

First printing control section 62 causes printer WM1 to execute a first printing process on at least first board 90 which is conveyed thereinto since the determination of determination section 61 that the elapsed time exceeds the allowable time. For example, first printing control section 62 can cause printer WM1 to execute a first printing process also on second and later boards 90 which are conveyed thereinto since the determination in such a case that the printing quality of first board 90 has not yet been recovered. Whether the printing quality is recovered can be determined by printing inspector WM2 and can also be determined by the operator.

1-3-4. Movement Controller 63

Movement controller 63 separates mask 70 and board 90 from each other after first printing control section 62 executes the first printing process and then brings relevant mask 70 and board 90 into abutment with each other again after the separation (step S14 shown in FIG. 4).

Movement controller 63 separates mask 70 and board 90 from each other in such a state that solder 80 is supplied to opening portion 71 in mask 70 by the first printing process, whereby a flux of solder 80 remaining in opening portion 71 in mask 70 and a flux of solder 80 supplied newly are made to mix easily, facilitating the low of solder 80. The mixture of the fluxes is facilitated further as a result of movement controller 63 bringing mask 70 and board 90 into abutment with each other again after the separation, whereby solder 80 is allowed to flow more easily.

Movement controller 63 can separate mask 70 and board 90 from each other by lowering board 90 relative to mask 70 and can bring mask 70 and board 90 into abutment with each other again by lifting up board 90 after the separation. In addition, movement controller 63 can also separate mask 70 and board 90 from each other by lifting up mask 70 relative to board 90 and can also bring mask 70 and board 90 into abutment with each other again by lowering mask 70 after the separation.

In the present embodiment, movement controller 63 lowers board 90 relative to mask 70 using board holding section 11 shown in FIG. 2 to thereby separate mask 70 and board 90 from each other. In addition, movement controller 63 lifts up board 90 after the separation using board holding section 11 to thereby bring mask 70 and board 90 into abutment with each other again.

Movement controller 63 can increase the wait time defined as extending from the end of the printing process to the separation of mask 70 and board 90 to be longer than a wait time adopted in the printing process executed when determination section 61 determines that the elapsed time does not exceed the allowable time. As a result, a flux of solder 80 supplied newly is likely to seep out into solder 80 remaining in opening portion 71 in mask 70 more easily than in a case in which the wait time is not changed. As a result, the fluxes are mixed together more easily than in a case in which the wait time is not changed, whereby solder 80 is allowed to flow easily.

The wait time can be acquired in advance through simulation, measurement using an actual measurement machine, or the like as in the case with the printing conditions described above. In addition, the wait time can also be set by, for example, the operator, as in the case with the printing conditions described above. In this case, the operator can input a predetermined wait time for wait time after a first printing process on the display screen shown in FIG. 8. FIG. 8 shows that the operator inputs time TM2 as wait time and that the wait time is set to time TM2.

Additionally, movement controller 63 can also decrease a separation speed, which is a speed at which mask 70 and board 90 are separated from each other, lower than that in the case of the printing process executed when determination section 61 determines that the elapsed time does not exceed the allowable time. As a result, a deformation (for example, a collapse) or the like of solder 80 printed on board 90 is suppressed more easily than in a case in which the separation speed is not changed.

Further, movement controller 63 can also decrease an abutment speed, which is a speed at which mask 70 and board 90 are brought into abutment with each other, lower than that in the case of the printing process executed when determination section 61 determines that the elapsed time does not exceed the allowable time. As a result, a deformation (for example, a collapse) or the like of solder 80 printed on board 90 is suppressed more easily than in a case in which the abutment speed is not changed. The separation speed and the abutment speed can be acquired in advance through simulation, measurement with an actual measurement machine, or the like, as in the case with the printing conditions described above. Additionally, the separation speed and the abutment speed can also be set by, for example, the operator, as in the case with the printing conditions described above.

Board holding section 11 shown in FIG. 2 holds board 90 in such a state that an upper surface of board 90 adheres to a lower surface of mask 70. Board holding section 11 holds board 90 by, for example, sucking a lower surface of board 90. Board conveyance device 10 can include a pressing member configured to press board 90 from the upper surface of relevant board 90 in order to increase the degree of adhesion between the lower surface of board 90 and a suction section. However, there is a possibility that a deformation (for example, a collapse) or the like of solder 80 printed on board 90 is caused as a result of pressing board 90.

Then, movement controller 63 can regulate the pressing of board 90 by the pressing member when movement controller 63 separates mask 70 and board 90 from each other after the first printing process is executed and then brings mask 70 and board 90 into abutment with each other again after the separation. As a result, a deformation (for example, a collapse) or the like of solder 80 printed on board 90 is suppressed more easily than a case in which board 90 is pressed.

In addition, since movement controller 63 separates mask 70 and board 90 from each other after the first printing process is executed, and brings mask 70 and board 90 into abutment with each other again after the separation, there is a possibility that a relative position between mask 70 and board 90 is changed. Then, movement controller 63 need only cause printer WM1 to align mask 70 with board 90 in terms of position when movement controller 63 brings mask 70 and board 90 into abutment with each other again. As a result, printer WM1 can print solder 80 in a predetermined printing position on board 90 in a second printing process.

FIG. 9 shows an example of positioning reference portions FM1, FM2 provided on mask 70 and substrate 90. For example, movement controller 63 can cause board conveyance device 10 shown in FIG. 2 to align mask 70 with board 90 in terms of position. Specifically speaking, board conveyance device 10 can move board 90 in such a manner that positioning reference portion FM1 of mask 70 aligns with positioning reference portion FM1 of board 90 and that positioning reference portion FM2 of mask 70 aligns with positioning reference portion FM2 of board 90.

For example, mark camera FC0 shown in FIG. 2 images a predetermined area including positioning reference portion FM1 of mask 70. Mark camera FC0 images a predetermined area including positioning reference portion FM2 of mask 70. Similarly, mark camera FC0 images a predetermined area including positioning reference portion FM1 of board 90. Mark camera FC0 images a predetermined area including positioning reference portion FM2 of board 90.

Control device 50 image processes the images so captured and recognizes positioning reference portions FM1, FM2 of mask 70 and positioning reference portions FM1, FM2 of board 90. Board conveyance device 10 adjusts the position of board 90 in such a manner that positioning reference portion FM1 of mask 70 aligns with positioning reference portion FM1 of board 90 and that positioning reference portion FM2 of mask 70 aligns with positioning reference portion FM2 of board 90 and then positions board 90. Movement controller 63 can also cause printer WM1 to align mask 70 with board 90 in terms of position by moving mask 70 relative to board 90.

1-3-5. Second Printing Control Section 64

Second printing control section 64 causes printer WM1 to execute a second printing process on board 90 after movement controller 63 brings mask 70 and relevant board 90 into abutment with each other again (step S15 shown in FIG. 4).

Since movement controller 63 separates mask 70 and board 90 from each other and then brings mask 70 and board 90 into abutment with each other again after the separation, solder 80 is ready to flow easily. In this state, second printing control section 64 causes printer WM1 to execute a second printing process. The viscosity of solder 80 resulting when the second printing process is executed is decreased lower than that resulting when the first printing process is executed. Further, when mask 70 and board 90, on which printer WM1 has executed the second printing process, are separated from each other in order to convey out relevant board 90, solder 80 is ready to flow more easily, whereby solder 80 is ready to separate easily from wall surface 71a of opening portion 71.

Second printing control section 64 can change the control conditions when it causes printer WM1 to execute the second printing process, as in the case with first printing control section 62. For example, second printing control section 64 can decrease a printing speed, which is a speed at which squeegee 34 slides on mask 70, lower than a printing speed adopted in the printing process executed when determination section 61 determines that the elapsed time does not exceed the allowable time. This allows solder 80 to be supplied more easily to opening portion 71 than in a case in which the printing speed is not changed.

In addition, second printing control section 64 can increase a printing pressure, which is a pressure applied to mask 70 when squeegee 34 slides thereon, higher than a printing pressure adopted in the printing process executed when determination section 61 determines that the elapsed time does not exceed the allowable time. As a result, solder 80 is allowed to be supplied to opening portion 71 more easily than in the case that the printing pressure is not changed. In the case that the flow state of solder 80 is good, second printing control section 64 can also cause printer WM1 to execute the second printing process under the same conditions as those in the case of the printing process executed when determination section 61 determines that the elapsed time does not exceed the allowable time.

Additionally, printing control device 60 can also increase a wait time defined as extending from the end of the second printing process to the separation of mask 70 from board 90 to be longer than a waist time adopted in the printing process executed when determination section 61 determines that the elapsed time does not exceed the allowable time. Further, printing control device 60 can also decrease a separation speed at which mask 70 and board 90 are separated from each other after the end of the second printing process lower than that in the case of the printing process executed when determination section 61 determines that the elapsed time does not exceed the allowable time.

When determination section 61 determines that the elapsed time exceeds the allowable time, printing control device 60 can cause, for example, the storage device of control device 50 to store event information informing of occurrence of a state in which the elapsed time exceeds the allowable time. Second printing control section 64 can cause printer WM1 to execute the second printing process when the event information is stored in the storage device.

Then, when printer WM1 executes the second printing process on all boards 90 on which printer WM1 has executed the first printing process based on a command from first printing control section 62 based on a command from second printing control section 64, printing control device 60 deletes the event information from the storage device. As a result, printer WM1 can execute the normal printing process. In addition, the operator can also select Yes for a second printing process on the display screen shown in FIG. 8. In this case, too, second printing control section 64 causes printer WM1 to execute the second printing process.

2. Modified Aspect

There is a possibility that solder 80 or the like adheres to abutting surface 72 of mask 70 which is brought into abutment with board 90 when printer WM1 executed the printing process in the past. In addition, since movement controller 63 separates mask 70 and board 90 from each other after the first printing process has been executed and brings mask 70 and board 90 into abutment with each other again after the separation, there is a possibility that solder 80 printed on board 90 or the like adheres to abutting surface 72 of mask 70.

Then, printing control device 60 need only include further at least one of first cleaning section 65 and second cleaning section 66. As a result, foreign matters such as solder 80 or the like which adheres to abutting surface 72 of mask 70 can be removed, thereby improving the printing quality. In the present modified aspect, printing control device 60 includes determination section 61, first printing control section 62, movement controller 63, second printing control section 64, first cleaning section 65, and second cleaning section 66.

Figure 10:
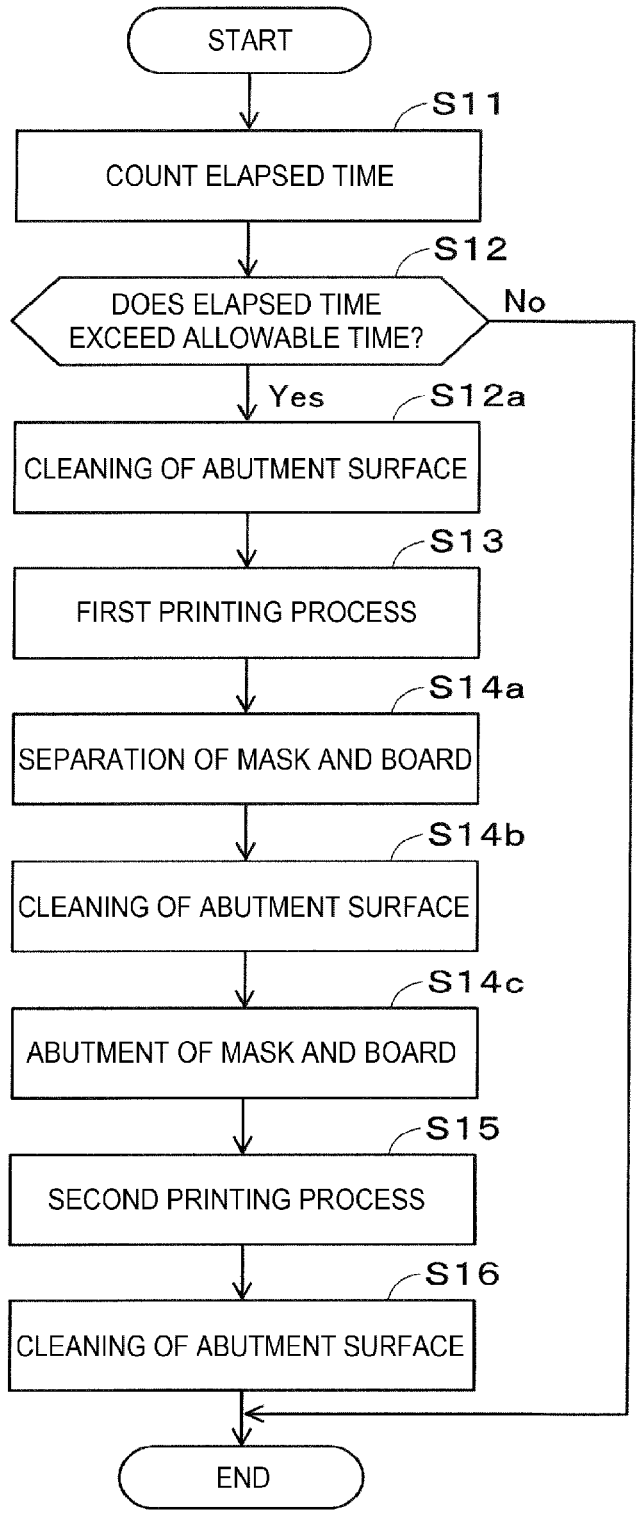
FIG. 10 A flowchart showing another example of a control procedure performed by the printing control device.

In the present modified aspect, printing control device 60 executes a control in accordance with a flowchart shown in FIG. 10. First cleaning section 65 executes processing shown in step S12a. Second cleaning section 66 executes processing shown in step S14b and step S16. In FIG. 10, step numbers like to those in the embodiment are given to like steps to those described in the embodiment, and like descriptions will be omitted in the present description.

A control executed by movement controller 63 is divided into processing shown in step S14a and processing shown in step 14c. Step S14a shows processing in which mask 70 and board 90 are separated from each other after first printing control section 62 executes a first printing process. Step S14c shows processing in which mask 70 and board 90 are brought into abutment with each other again after the separation.

When determination section 61 determines that the elapsed time exceeds the allowable time, first cleaning section 65 causes printer WM1 to clean abutting surface 72 of mask 70 which is brought into abutment with board 90 before first printing control section 62 executes a first printing process (step S12a shown in FIG. 10).

First cleaning section 65 can cause printer WM1 to clean abutting surface 72 of mask 70 before first board 90 is conveyed thereinto after the determination. In addition, first cleaning section 65 can also cause printer WM1 to clean abutting surface 72 of mask 70 after first board 90 has been conveyed thereinto after the determination. Further, in the case that first printing control section 62 causes printer WM1 to execute the first printing process on a predetermined number of boards 90 conveyed thereinto after the determination, first cleaning section 65 can also cause printer WM1 to clean abutting surface 72 of mask 70 for each of the predetermined number of boards 90 before or after each of the predetermined number of boards 90 are conveyed into printer WM1.

Printer WM1 need only be able to clean abutting surface 72 of mask 70, and hence, no limitation is imposed on a cleaning method adopted by printer WM1. For example, printer WM1 may adopt dry cleaning or may adopt wet cleaning. In addition, no limitation is imposed on the number of times of cleaning. In the present modified aspect, printer WM1 includes a cleaning unit. The cleaning unit includes a supply reel for supplying a cleaning tape therefrom and a take-up reel for taking up the cleaning tape therearound.

The cleaning tape is pulled out from the supply reel and is taken up by the take-up reel after circulating over an upper surface of a cleaning head. Abutting surface 72 of mask 70 is wiped by the cleaning tape to thereby be cleaned up by moving the cleaning head along the Y-axis direction with the cleaning tape left in abutment with abutting surface 72 of mask 70. The cleaning of this type is referred to as the dry cleaning. During execution of the cleaning, printer WM1 can also drop washing liquid on the cleaning tape. The cleaning of this type is referred to as the wet cleaning.

Second cleaning section 66 causes printer WM1 to clean abutting surface 72 of mask 70 which is brought into abutment with board 90 after movement controller 63 separates mask 70 and board 90 from each other (step S14b shown in FIG. 10). Printer WM1 can clean abutting surface 72 of mask 70 in the same manner as the manner executed when printer WM1 cleans abutting surface 72 of mask 70 based on the command from first cleaning section 65.

There is a possibility that the holding of board 90 is released after movement controller 63 separates mask 70 and board 90 from each other. Then, movement controller 63 need only confirm whether board 90 is held by board holding section 11. In the case that the holding of board 90 is released, movement controller 63 causes board holding section 11 to hold board 90. To do this, movement controller 63 need only cause printer WM1 to align mask 70 with board 90 in terms of position when it brings mask 70 and board 90 in abutment with each other again.

Second cleaning section 66 can cause printer WM1 to clean abutting surface 72 of mask 70 which is brought into abutment with board 90 even after second printing control section 64 has executed the second printing process (step S16 shown in FIG. 10). In this case, too, printer WM1 can clean abutting surface 72 of mask 70 in the same manner as the manner executed when printer WM1 cleans abutting surface 72 of mask 70 based on the command from first cleaning section 65.

In this way, second cleaning section 66 can cause printer WM1 to clean abutting surface 72 of mask 70 under the same conditions as those under which first cleaning section 65 causes printer WM1 to clean abutting surface 72 of mask 70. In addition, second cleaning section 66 can also cause printer WM1 to clean abutting surface 72 of mask 70 under different conditions from those under which first cleaning section 65 causes printer WM1 to clean abutting surface 72 of mask 70.

Specifically speaking, first cleaning section 65 can increase the number of times of cleaning of mask 70 to be higher than that adopted in the cleaning by second cleaning section 66. The number of times of cleaning can be acquired in advance through simulation, measurement with an actual measurement machine, or the like, as in the case with the printing conditions described above. In addition, the number of times of cleaning can also be set by, for example, the operator, as in the case with the printing conditions described above.

For example, in the case that second cleaning section 66 causes printer WM1 to execute the cleaning once, first cleaning section 65 can cause printer WM1 to execute the cleaning four times. In addition, a configuration can also be adopted in which first cleaning section 65 causes printer WM1 to execute the wed cleaning, while second cleaning section 66 causes printer WM1 to execute the dry cleaning.

Printing control device 60 can also cause, for example, the storage device of control device 50 to store event information informing that mask 70 is cleaned after occurrence of a state in which the elapsed time exceeds the allowable time, when printer WM1 cleans abutting surface 72 of mask 70 based on the command from first cleaning section 65. Second printing control section 64 can cause printer WM1 to execute the second printing process when the event information is stored in the storage device.

Then, when printer WM1 executes the second printing process on the predetermined number of boards 90 based on the command from second printing control section 64, and printer WM1 cleans abutting surface 72 of mask 70 for each of the predetermined number of boards 90 based on the command from the second cleaning section 66, printing control device 60 deletes the event information from the storage device. As a result, printer WM1 can execute the normal printing process.

3. Printing Control Method

What has been described heretofore about printing control device 60 is also true with a printing control method. Specifically speaking, the printing control method includes a determination step, a first printing control step, a movement control step, and a second printing control step. The determination step corresponds to a control executed by determination section 61. The first printing control step corresponds to a control executed by first printing control section 62. The movement control step corresponds to a control executed by movement controller 63. The second printing control step corresponds to a control executed by second printing control section 64. In addition, the printing control method can further include at least one of a first cleaning step and a second cleaning step. The first cleaning step corresponds to a control executed by first cleaning section 65. The second cleaning step corresponds to a control executed by second cleaning section 66.

4. Example of Advantageous Effects of Embodiment

Printing control device 60 includes determination section 61, first printing control section 62, movement controller 63, and second printing control section 64. As a result, when determination section 61 determines that the elapsed time exceeds the allowable time, first printing control section 62 can cause printer WM1 to execute the first printing process to thereby supply solder 80 to opening portion 71 in mask 70. Since movement controller 63 separates mask 70 and board 90 from each other in this state, solder 80 is allowed to flow easily. Since movement controller 63 brings mask 70 and board 90 into abutment with each other thereafter, solder 80 is allowed to flow more easily. As a result, the viscosity of solder 80 remaining in opening portion 71 in mask 70 is decreased to thereby allow solder 80 to separate from wall surface 71a of opening portion 71 easily. Since second printing control section 64 causes printer WM1 to execute the second printing process in this state, a reduction in the amount of solder printed on board 90 can be suppressed, thereby making it possible to suppress a deterioration in printing quality. What has been described heretofore about printing control device 60 is true with the printing control method.

REFERENCE SIGNS LIST

34: squeegee, 60: printing control device, 61: determination section, 62: first printing control section, 63: movement controller, 64: second printing control section, 65: first cleaning section, 66: second cleaning section, 70: mask, 71: opening portion, 72: abutting surface, 80: solder, 90: board, WM1: printer

The invention claimed is:

1. A printing control device comprising:
   a determination section configured to determine whether an elapsed time, which constitutes a time which elapses with no subsequent board being conveyed in since a point in time when a mask and a first board, on which a printer, configured to execute a printing process of printing a solder on the first board through an opening portion in the mask by a squeegee sliding on the mask, executes the printing process, are separated to convey out the first board, exceeds a predetermined allowable time;
   a first printing control section configured to cause the printer to execute the printing process for a first time on at least a second board which is conveyed in since the determination is made when the determination section determines that the elapsed time exceeds the allowable time;
   a movement controller configured to separate the mask and the second board from each other after the first printing control section executes the printing process for the first time and bring the mask and the second board into abutment with each other again after the separation; and
   a second printing control section configured to cause the printer to execute the printing process for a second time on the second board after the movement controller brings the mask and the second board into abutment with each other again.

2. The printing control device according to claim 1, comprising:
   a first cleaning section configured to cause the printer to clean an abutting surface of the mask which is brought into abutment with the second board before the first printing control section executes the printing process for a first time when the determination section determines that the elapsed time exceeds the allowable time.

3. The printing control device according to claim 1, wherein at least the first printing control section of the first printing control section and the second printing control section decreases a printing speed, which is a speed at which the squeegee slides on the mask, lower than a printing speed used in the printing process executed when the determination section determines that the elapsed time does not exceed the allowable time.

4. The printing control device according to claim 1, wherein at least the first printing control section of the first printing control section and the second printing control section increases a printing pressure, which is a pressure applied to the mask when the squeegee slides on the mask, higher than a printing pressure so applied in the printing process executed when the determination section determines that the elapsed time does not exceed the allowable time.

5. The printing control device according to claim 1, wherein the movement controller increases a wait time, which is defined as extending from an end of the printing processing to a separation of the mask and the second board from each other, to be longer than a wait time adopted in the printing process executed when the determination section determines that the elapsed time does not exceed the allowable time.

6. The printing control device according to claim 1, wherein the movement controller reduces an abutment speed, which is a speed at which the mask and the second board are brought into abutment with each other, lower than an abutment speed adopted in the printing process executed when the determination section determines that the elapsed time does not exceed the elapsed time.

7. The printing control device according to claim 1, wherein the movement controller causes the printer to align the mask with the second board in terms of position when the movement controller brings the mask and the second board into abutment with each other again.

8. The printing control device according to claim 1, comprising:
   a second cleaning section configured to cause the printer to clean an abutting surface of the mask which is brought into abutment with the second board after the movement controller separates the mask and the second board from each other.

9. The printing control device according to claim 8, wherein the second cleaning section causes the printer to clean an abutting surface of the mask which is brought into abutment with the second board even after the second printing control section has executed the printing process for a second time.

10. The printing control device according to claim 8, comprising:
    a first cleaning section configured to cause the printer to clean an abutting surface of the mask which is brought into abutment with the second board before the first printing control section executes the printing process for a first time when the determination section determines that the elapsed time exceeds the allowable time,
    wherein the first cleaning section increases a frequency at which the first cleaning section cleans the mask higher than a frequency at which the second cleaning section cleans the mask.

11. A printing control method comprising:
    a determination step configured to determine whether an elapsed time, which constitutes a time which elapses with no subsequent board being conveyed in since a point in time when a mask and a first board, on which a printer, configured to execute a printing process of printing a solder on the first board through an opening portion in the mask by a squeegee sliding on the mask, executes the printing process, are separated to convey out the first board, exceeds a predetermined allowable time;

a first printing control step configured, when the determination step determines that the elapsed time exceeds the allowable time, to cause the printer to execute the printing process for a first time on at least a second board which is conveyed in since the determination;

a movement control step configured to separate the mask and the second board from each other after the first printing control step causes the printing process to be executed for the first time and bring the mask and the second board into abutment with each other again after the separation; and a second printing control step configured to cause the printer to execute the printing process for a second time on the second board after the movement control step brings the mask and the second board into abutment with each other again.

* * * * *